(12) United States Patent
Müller et al.

(10) Patent No.: US 7,156,922 B2
(45) Date of Patent: Jan. 2, 2007

(54) MULTI-CHAMBER INSTALLATION FOR TREATING OBJECTS UNDER VACUUM, METHOD FOR EVACUATING SAID INSTALLATION AND EVACUATION SYSTEM THEREFOR

(75) Inventors: Peter Müller, Cologne (DE); Lutz Arndt, Troisdorf (DE)

(73) Assignee: Leybold Vakuum GmbH, Cologne (DE)

( * ) Notice: Subject to any disclaimer, the term of this patent is extended or adjusted under 35 U.S.C. 154(b) by 194 days.

(21) Appl. No.: 10/492,033

(22) PCT Filed: Sep. 28, 2002

(86) PCT No.: PCT/EP02/10918

§ 371 (c)(1),
(2), (4) Date: Apr. 5, 2004

(87) PCT Pub. No.: WO03/033761

PCT Pub. Date: Apr. 24, 2003

(65) Prior Publication Data

US 2005/0000436 A1    Jan. 6, 2005

(30) Foreign Application Priority Data

Oct. 11, 2001    (DE)    ................... 101 50 015

(51) Int. Cl.
| | |
|---|---|
| *C23C 16/44* | (2006.01) |
| *C23C 16/54* | (2006.01) |
| *C23C 14/22* | (2006.01) |
| *C23C 14/56* | (2006.01) |
| *F04C 23/00* | (2006.01) |

(52) U.S. Cl. ............... 118/715; 118/719; 156/345.29; 417/3; 417/199.1; 417/250; 417/423.4; 417/423.5; 418/1; 418/5; 418/13

(58) Field of Classification Search ............... 118/715, 118/719; 156/345.29; 215/1; 415/1; 417/3, 417/199.1, 202, 250, 410.3, 423.4, 423.5; 418/1, 5, 9, 13

See application file for complete search history.

(56) References Cited

U.S. PATENT DOCUMENTS

| | | | | |
|---|---|---|---|---|
| 3,644,051 | A * | 2/1972 | Shapiro ....................... 415/90 |
| 4,768,699 | A * | 9/1988 | Abbagnaro ................. 228/102 |
| 4,822,251 | A * | 4/1989 | Amrath et al. ............... 417/63 |
| 4,968,221 | A * | 11/1990 | Noll .......................... 417/295 |
| 5,156,532 | A | 10/1992 | Arndt et al. ................ 417/360 |
| 5,228,838 | A | 7/1993 | Gebele et al. ................ 417/53 |
| 5,641,960 | A | 6/1997 | Okubo et al. ............... 250/310 |
| 5,733,104 | A | 3/1998 | Conrad et al. ............. 417/44.1 |
| 6,030,189 | A * | 2/2000 | Bohm et al. ............. 417/423.4 |
| 6,106,223 | A * | 8/2000 | Leyshon ...................... 415/90 |
| 6,193,461 | B1 * | 2/2001 | Hablanian .................... 415/90 |
| 6,196,810 | B1 * | 3/2001 | Taniguchi et al. .......... 417/248 |
| 6,251,192 | B1 | 6/2001 | Kawamura et al. ......... 118/719 |

(Continued)

FOREIGN PATENT DOCUMENTS

DE    35 06 433 A1    10/1985

(Continued)

*Primary Examiner*—Jeffrie R. Lund
(74) *Attorney, Agent, or Firm*—Fay, Sharpe, Fagan, Minnich & McKee, LLP

(57) ABSTRACT

A multi-chamber installation (1) treats objects under vacuum. An evacuation system (5) is connected to a plurality of chambers (2, 3, 4). To reduce the complexity of the evacuation process, a forepump (5) has several stages (11, 12, 13). Each of said stages is connected to one of the chambers (2, 3, 4).

16 Claims, 2 Drawing Sheets

U.S. PATENT DOCUMENTS

| | | | |
|---|---|---|---|
| 6,446,651 B1 | 9/2002 | Abbel | 137/1 |
| 6,669,996 B1* | 12/2003 | Ueno et al. | 427/571 |
| 7,011,491 B1* | 3/2006 | Englander | 415/90 |
| 2002/0136643 A1* | 9/2002 | Eberl | 417/248 |
| 2005/0000436 A1* | 1/2005 | Muller et al. | 118/719 |

FOREIGN PATENT DOCUMENTS

| | | |
|---|---|---|
| DE | 90 07 544 U | 8/1992 |
| DE | 42 13 763 A1 | 10/1993 |
| DE | 43 31 589 C2 | 6/1994 |
| DE | 197 00 406 A1 | 7/1998 |
| DE | 199 29 519 A1 | 1/2001 |
| DE | 100 48 210 A1 | 5/2002 |

\* cited by examiner

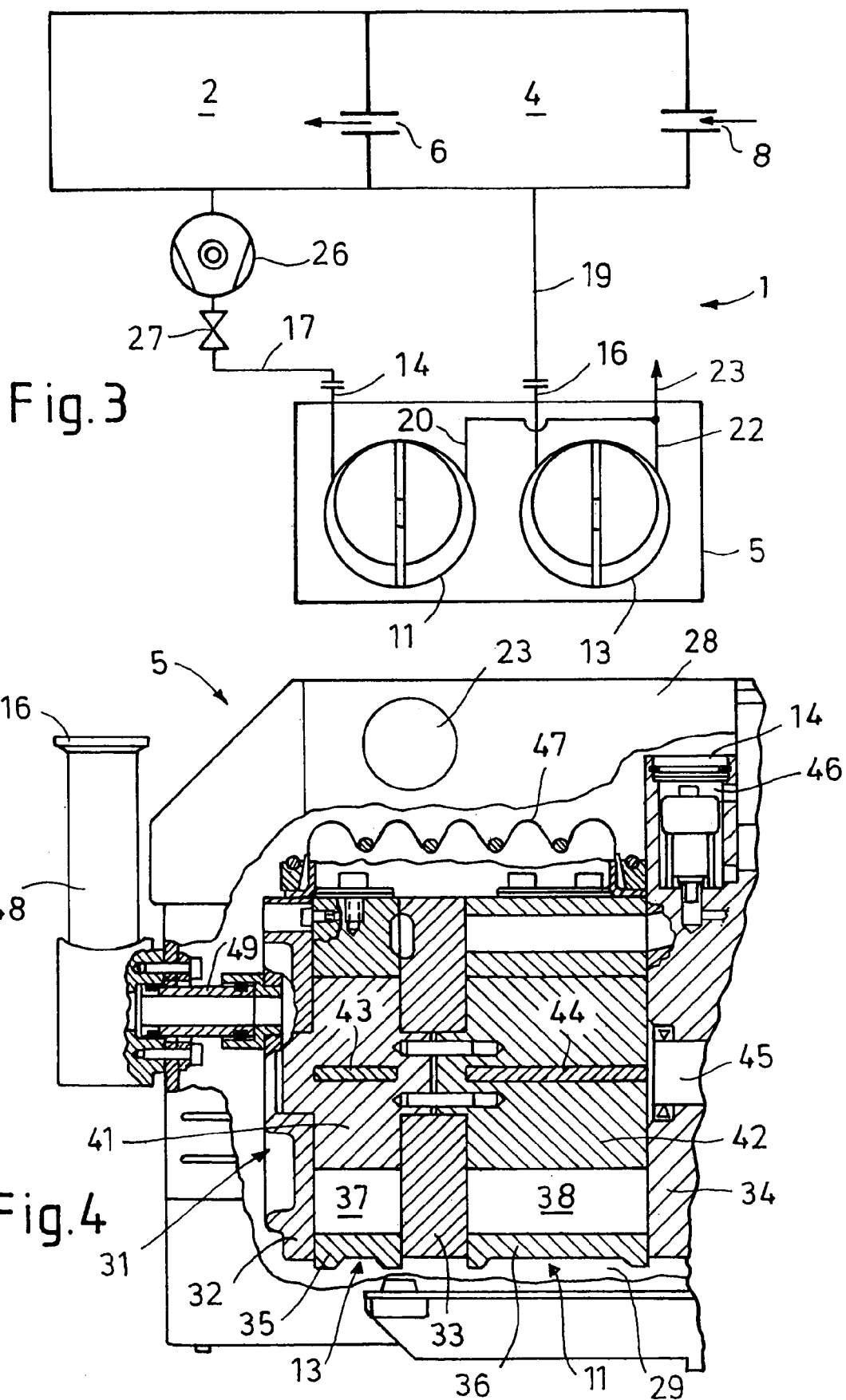

MULTI-CHAMBER INSTALLATION FOR TREATING OBJECTS UNDER VACUUM, METHOD FOR EVACUATING SAID INSTALLATION AND EVACUATION SYSTEM THEREFOR

BACKGROUND OF THE INVENTION

The invention relates to a multi-chamber installation for treating objects under vacuum, in which an evacuation system that is connected to the chambers. Moreover, the present invention relates to a method for evacuating said installation as well as an evacuation system therefor.

Multi-chamber installations of the aforementioned kind are known. They serve the purpose of degassing, coating (metallization, for example) or etching substrates. Known methods of this kind include chemical vapor deposition (CVD). and processes for producing digital video disks (DVDs). Commonly, such an installation is equipped with a process chamber, with one or several pre-chambers with load lock function being located upstream. The load locks are opened for the period of time while introducing or removing substrates, so that high pressure variations occur differing from chamber to chamber.

In the instance of a multi-chamber installation equipped with two chambers, it is known to employ two separate vacuum pumps in order to be able to evacuate as rapidly as possible each of the chambers after closing the corresponding load lock.

It is the task of the present invention to reduce in the instance of multi-chamber installations of the aforementioned kind or similar kind, the complexity for the evacuation system.

SUMMARY OF THE INVENTION

This task is solved by the present invention through the characteristic features of the patent claims.

In that each of the stages is equipped with an inlet and in that each of the inlets is connected to one of the chambers, now only one vacuum pump is required in order to produce the desired pressures—be they approximately the same or also different—in the different chambers as rapidly as possible and maintain these. Several pumps each with a drive motor are no longer required. Also installation complexity—both mechanical and also electrical—is reduced. Preferably the pump stages are operated in parallel so that they have the function of two independent vacuum pumps.

An exemplary oil-sealed rotary vane forevacuum pump is illustrated in U.S. Pat. No. 5,156,532.

Typical forevacuum pumps are oil-sealed rotary vane pumps as they are known, for example, from DE-U-90 07 544.

Further advantages and details of the present invention shall be explained with reference to the examples of embodiments depicted schematically in drawing FIGS. 1 to 4.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

FIG. 3 depicts a multi-chamber installation according to drawing FIG. 2 with an additional high vacum pump, and FIG. 4 depicts a sectional view through a two-stage forevacum pump.

DETAILED DESCRIPTION OF THE PREFERRED EMBODIMENTS

Figure 1:
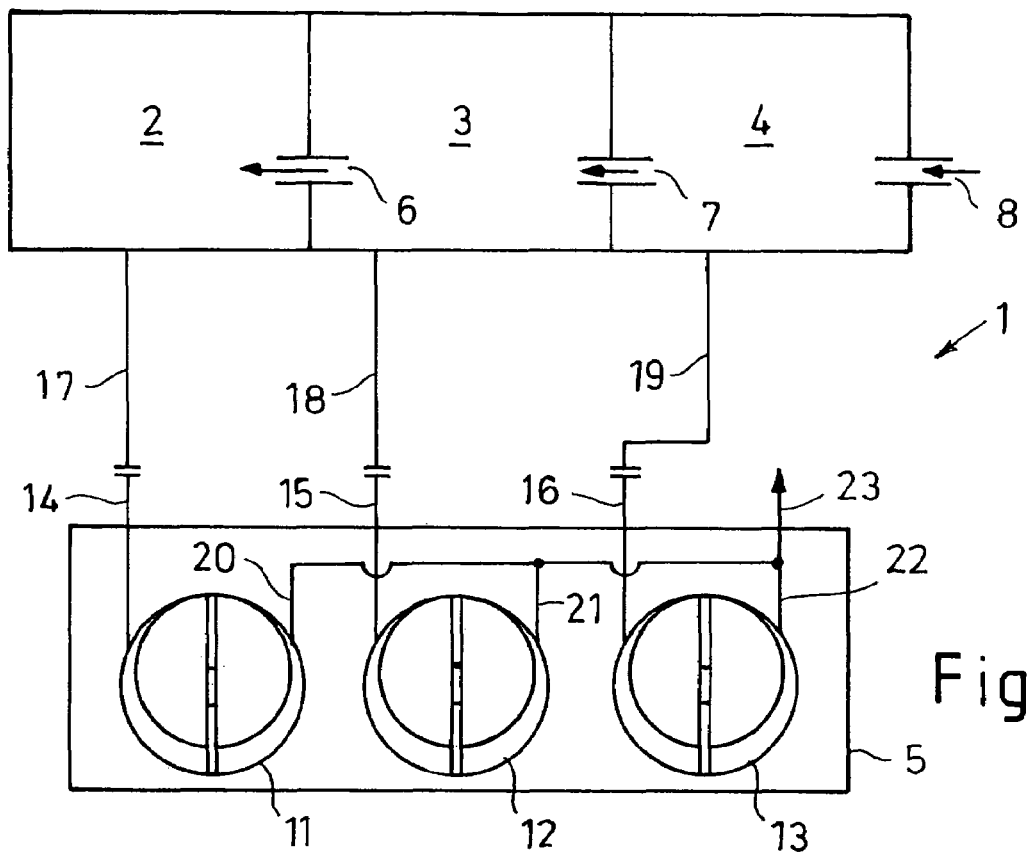
FIG. 1 depicts a multi-chamber installation with three chambers and a three stage forevacuum pump.

In the drawing figures, the multi-chamber installation is generally designated as 1, the chambers with 2, 3 and 4, and the evacuation system with 5. In the instance of the chambers 2 to 4, these each include a process chamber 2, to which further chambers 3, 4, (in drawing FIG. 1) or only 4 (in drawing FIG. 2, 3) are associated. Slotted load locks are schematically depicted and designated as 6, 7, and 8. The evacuation system 5 is designed as a multi-stage forevacuum pump.

In the example of the embodiment in accordance with drawing FIG. 1, three chambers 2, 3, 4 are present. Correspondingly, the forevacuum pump 5 has three stages 11, 12, 13 each with one inlet 14, 15, respectively 16. Each of the inlets 14, 15, 16 is connected via one each connecting line 17, 18, respectively in 19 to one of the chambers 2, 3, 4. The outlets 20, 21, 22 of the pump stages 11, 12, 13 open out within the pump 5 into a joint discharge line, so that the pump 5 has only one outlet 23. In the instance of the pumping stages 11, 12, 13 having different pumping capacities, it is then expedient to connect the stage with the highest pumping capacity to the process chamber 2, so that there sufficiently low pressures are attainable as rapidly as possible.

Figure 2:
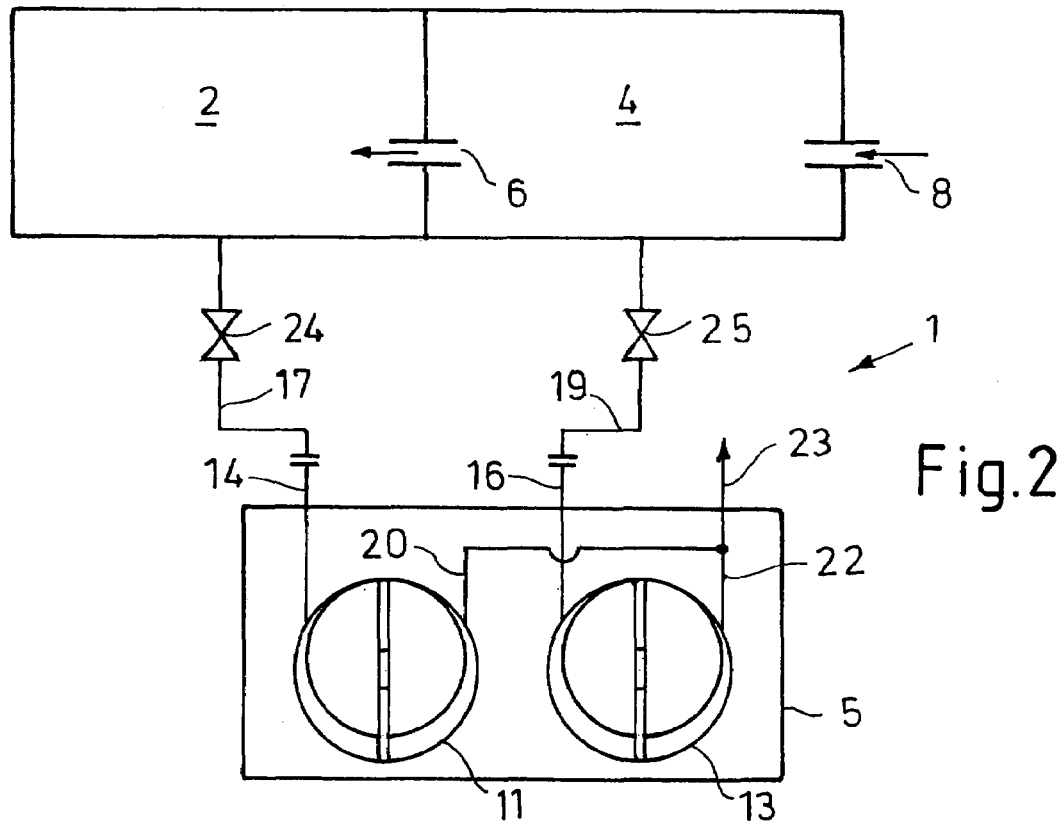
FIG. 2 depicts a multi-chamber installation with two vacuum chambers and a two-stage forevacuum pump.

In the embodiment according to drawing FIG. 2, only two chambers 2, 4 and correspondingly two pump stages 11, 13 are provided. Located in the connecting lines 17 and 19 are valves 24 and 25 in order to separate from the evacuation system 5 one or both chambers 2, 4 in case these are vented.

In the embodiment according to drawing FIG. 3, there is located in the connecting line 17 a turbomolecular vacuum pump 26 and—on its delivery side—a valve 27. High vacuum pumps of this kind excel through higher pumping capacities and lower ultimate pressures compared to forevacuum pumps, however, they require a forevacuum pump which in the instance of the case presented, forms the pumping stage 11. This embodiment is expedient for processes being performed in the process chamber 2 in which relatively low pressures ($10^{-2}$ mbar, for example) shall be attained as rapidly as possible. Forevacuum pumps are also capable of attaining ultimate pressures of approximately 1 mbar to $5 \times 10^{-2}$ mbar; however, through the utilisation of high vacuum pumps it is possible to attain even lower pressures significantly faster.

Drawing FIG. 4 depicts a partial sectional view through a commercial two-stage forevacuum pump 5 which has been modified for utilisation in a multi-chamber installation. Said forevacuum pump is equipped with an outer casing 28 with an oil sump 29. Accommodated in the outer casing 28 is the actual pump 31, a rotary vane vacuum pump 31 with two stages 11 and 13. It comprises three discs 32, 33, 34 with pump rings 35, 36 accommodated in between. The pump rings 35, 36 form of the pump chambers 37, 38, in which there is located one each eccentrically arranged rotor 41, respectively 42 with its vanes 43, respectively 44. The rotor 42 is linked to the shaft 45 of a drive motor not depicted. Moreover, the bearing stubs of the rotors 41, 42 are linked to each other in the area of the disk 33. The diameter of the rotors 41, 42 is equal, their lengths are different. Thus there result for the two pump stages 11, 13 different pumping capacities. When employing the presented pump as a two-stage vacuum pump with series connected pump stages 11, 13, the longer pump stage forms the inlet pump stage and the shorter one the delivery pump stage.

The pump 5 presented has been modified such that the pump stages 11, 13 may be operated in parallel. The inlet equipped with an anti-suck back valve 46 which is present in any case in pumping stage 11 serves as inlet 14. The outlet of pumping stage 11, not depicted in detail, is no longer linked to the inlet of the pumping stage 13, but instead opens out below the felt hat 47. The pumping stage 13 has been equipped with an independent intake port 48 forming the inlet 16. The intake port 48 is linked via pipe section 49 run out of the casing 28 to the pump chamber 37. The not depicted outlet of this pumping stage 13 also opens out under the felt hat 47. The felt hat 47 serves the purpose of calming down the flow and coarsely separating the oil. Further separators which need to be connected to the outlets 23 need, compared to the state-of-the-art, to be present only once.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the eqiuvalents thereof.

Having thus described the preferred embodiments, the invention is now claimed to be:

1. A multi-chamber installation for treating objects under vacuum, comprising:
   a forevacuum pump including:
   a common housing;
   a plurality of inlets through the housing, which plurality of inlets are connected with a plurality of chambers to be evacuated;
   a plurality of fluidicly independent pumping stages arranged in parallel in the common housing to be driven together by a common drive, each of said pumping stages being connected with one of the inlets, the chambers being evacuated fluidicly independently from each other; and
   at least one outlet for discharging gas from the pumping stages to atmospheric pressure.

2. The installation according to claim 1, wherein the number of chambers and the number of pumping stages of the forevacuum pump are equal.

3. The installation according to claim 1, wherein the plurality of chambers includes a process chamber and at least one pre-chamber linked to the process chamber, the pumping stages of the forevacuum pump having different pumping capacities, the stage with the highest pumping capacity being connected to the process chamber.

4. The installation according to claim 3, further including:
   a connecting line between the process chamber and an inlet of the corresponding pumping stage; and
   a high vacuum pump located in the connecting line.

5. The evacuation system according to claim 4 wherein the high vacuum pump is a turbomolecular vacuum pump.

6. The installation according to claim 1 wherein the forevacuum pump includes:
   a separate rotor for each of the parallel stages, all of the rotors being commonly driven and sharing a common oil sump.

7. The installation according to claim 6 wherein all of the parallel stages are connected with a common outlet and further including:
   a single oil separator connected to the outlet for separating oil from the discharged gas.

8. A method for operating a multi-chamber installation for treating objects under vacuum, where with the aid of an evacuation system vacuum pressures are produced in a plurality of chambers, the method comprising:
   producing the vacuum pressures with a forevacuum pump with a plurality of pumping stages in a common housing, the common housing being equipped with a plurality of inlets, each inlet being connected to one of the chambers and being equipped with a common outlet connected to atmosphere; and
   operating the pumping stages in parallel.

9. The method according to claim 8, further including:
   evacuating the chambers with pumping stages having different pumping capacities.

10. The method according to claim 9, further including:
    evacuating a process chamber with a one of the pumping stages which has the highest pumping capacity.

11. The method according to claim 9, further including:
    evacuating a process chamber with a high vacuum pump; and
    producing a forevacuum pressure required by the high vacuum pump by one of the pumping stages.

12. The method according to claim 8 wherein producing the vacuum pressures includes:
    driving the parallel pump stages in unison with a common drive, the pumping stages and the common drive being disposed in a common housing.

13. A multi-stage evacuation system for a multi-chamber installation, the evacuation system including a multistage forevacuum pump, the multistage forevacuum pump having:
    a plurality of pumping stages arranged to pump in parallel,
    a plurality of inlets, each of the inlets providing a fluidic connection with one chamber of the multi-chamber installation, and
    an outlet to atmosphere such that the pumping stages of the multistage forevacuum pump operate in parallel to draw vacuum pressures in the chambers.

14. The evacuation system according to claim 13, further including:
    a high vacuum pump, one of the stages of the forevacuum pump being connected with the high vacuum pump for producing a forevacuum for the high vacuum pump.

15. The evacuation system according to claim 13, wherein the forevacuum pump is a rotary vane vacuum pump.

16. In an evacuation system for a multi-chamber installation, a multi-stage forevacuum pump comprising:
    an outer casing;
    a plurality of pumping stages mounted in the outer casing to pump in parallel, each pumping stage having a separate inlet for connection with a corresponding chamber of the multi-chamber installation, each of the parallel pumping stages having an outlet, which outlets are joined within the casing to define a common outlet, such that the pumping stages pump gas in parallel from their respective inlets to the common outlet;
    a common oil separator connected with the common outlet.

* * * * *